(12) United States Patent
Casse

(10) Patent No.: US 8,352,238 B2
(45) Date of Patent: Jan. 8, 2013

(54) METHOD AND DEVICE FOR INTEGRATING A RF GPS EMULATOR IN A SIMULATION ENVIRONMENT

(75) Inventor: Patrice Casse, Merville (FR)

(73) Assignee: Airbus Operations SAS, Toulouse (FR)

( * ) Notice: Subject to any disclaimer, the term of this patent is extended or adjusted under 35 U.S.C. 154(b) by 286 days.

(21) Appl. No.: 12/766,168

(22) Filed: Apr. 23, 2010

(65) Prior Publication Data
US 2010/0305932 A1   Dec. 2, 2010

(30) Foreign Application Priority Data
May 19, 2009   (FR) .................................... 09 02453

(51) Int. Cl.
*G06F 9/455* (2006.01)
(52) U.S. Cl. ..................... 703/23; 703/13; 342/357.2
(58) Field of Classification Search ............. 703/23
See application file for complete search history.

(56) References Cited

U.S. PATENT DOCUMENTS

| | | | | |
|---|---|---|---|---|
| 4,797,677 | A * | 1/1989 | MacDoran et al. | 342/352 |
| 7,983,838 | B1 * | 7/2011 | Mislan | 701/466 |
| 8,130,141 | B2 * | 3/2012 | Pattabiraman et al. | 342/357.29 |
| 2003/0148761 | A1 | 8/2003 | Gaal | 455/423 |
| 2004/0006444 | A1 | 1/2004 | Kang et al. | 702/152 |
| 2007/0129922 | A1 * | 6/2007 | Lee et al. | 703/13 |

FOREIGN PATENT DOCUMENTS
EP   1 647 832 A1   4/2006
EP   1647832 A1 *  4/2006

OTHER PUBLICATIONS

Work et al ("GPS Synchronized Measurements for Real-Time Hardware-In-The-Loop Experiments", IEEE International Instrumentation and Measurements Technology Conference, May 12-15, 2008).*
Maraffio, Kanea, "GPS Receiver Testing Issues and Techniques", Navigation Technology for the 3rd Millennium; Proceedings of the 52nd Annual Meeting of the Institute of Navigation, pp. 83-92, 1996.*
R. J. Handley, et al., "Hardware-In-The-Loop Testing of the NATO Standardisation Agreement 4572 Interface Using High Precision Navigation Equations," Position, Location and Navigation Symposium; 2008 IEEE/ION; May 5, 2008; XP031340801; pp. 441-448.

* cited by examiner

*Primary Examiner* — Mary C Jacob
(74) *Attorney, Agent, or Firm* — Oblon, Spivak, McClelland, Maier & Neustadt, L.L.P.

(57) ABSTRACT

A method for integration of a GPS emulator in a simulation environment includes operating a computer adapted for using a simulation timer and configured to receive a signal of x_PPS type. For each pulse detected on the x_PPS signal, a counter is updated with a number of detected pulses and a value of the simulation timer is stored. A given simulation time moment is evaluated according to the detected and counted number of pulses, a current value of the simulation timer, and the stored value of the simulation timer. A related device and computer readable medium are also disclosed.

16 Claims, 4 Drawing Sheets

METHOD AND DEVICE FOR INTEGRATING A RF GPS EMULATOR IN A SIMULATION ENVIRONMENT

BACKGROUND OF THE INVENTION

1. Field of the Invention

This invention relates to location by GPS signals and more particularly to a method and a device for integration of an RF GPS emulator in a simulation environment.

2. Discussion of Related Art

The development of new vehicles, in particular aircraft, requires numerous simulations. Depending on the state of development of the vehicle and the objective sought, these simulations may be purely software, hardware or mixed, that is to say based on software and hardware components. In this way, the integration of actual components such as computers, sensors and actuators may be simulated.

Furthermore, in order to study the reactions of the vehicle or of certain of these components, it may be necessary to integrate emulators into the simulation. Emulators are used to reproduce the performance of a part of the vehicle or that of an outside element interacting with a part of the vehicle. Again, these emulators may be software, hardware or mixed.

In particular, there are emulators called GPS (abbreviation for Global Positioning System in English terminology) emulators or RF GPS (abbreviation for Radio Frequency) emulators that produce GPS signals, similar to those received from satellites, from indications of position and time. In this way, from a spatial position of latitude, longitude and altitude type and an indication of time, it is possible to reconstitute the signals that would be received by a GPS sensor located at this point at this moment. Depending on the emulators, these signals are electromagnetic waves or corresponding electrical signals.

This type of emulator is used, in particular, to test the navigation systems of aircraft, ships and automobiles.

Nonetheless, because of the precision of location calculated by GPS and the speed of the vehicles using the navigation systems, the indications of position and time generally must be extremely precise in order to validate the functioning of the simulated pieces of equipment.

BRIEF SUMMARY OF THE INVENTION

FIG. 1 schematically illustrates a simulation environment for a navigation system using an RF GPS emulator. The simulation here is run on a computer 100 of PC (abbreviation for Personal Computer in English terminology) type connected to an RF GPS emulator 105 used to provide GPS signals from data provided by the computer.

Computer 100 comprises an expansion card 110, for example input/output card PCI-215 of the company Amplicon Liveline, which, in addition to a module for digital input/output management, integrates a timer module 115 that can be controlled from an external signal in order to allow a synchronization between the computer 100 and an external device. The timer of the expansion card 110 thus may have servo-control. Optionally, computer 100 may be connected, via expansion card 110, to actual components of the vehicle, referenced 120, to use these components in the simulation.

RF GPS emulator 105, for example the emulator GSS7790 of the company Spirent, is adapted for providing a timer synchronization signal, for receiving a position signal and a time signal so as to transmit GPS signals similar to those sent out by satellites. In this way, emulator 105 transmits a timer synchronization signal 125 to timer module 115 of expansion card 110 connected to computer 100 so as to synchronize the timers of computer 100 and emulator 105.

During simulation, computer 100 transmits a position signal 130 and a time signal 135 to emulator 105, via expansion card 110. From the signals 130 and 135, the emulator determines the corresponding GPS signal 140 and transmits it to the actual components 120 that make up a GPS receiver. Naturally, signals 130 and 135 may be combined into a single signal.

While the architecture of computer 100 makes it possible to accommodate expansion card 110, numerous simulation systems have specific architectures for optimizing the running of simulations, these architectures not making it possible to receive such expansion cards. Only standard input/output-type expansion cards may be used in these systems.

Furthermore, because of the nature and frequencies of the synchronization signals used, the length of the electrical connection used between the computer and the emulator is limited. This limit generally is a few meters, typically less than two meters. The use of a simulation in which remote devices are used therefore generates problems of hardware organization.

There thus is a need for precisely synchronizing an RF GPS emulator with a computer or a set of computers used for performing a simulation in particular using guidance functions so that the GPS signals generated correspond precisely to the moment at which a position is transmitted. There also is a need to increase the distance between the equipment items used in the simulations.

The invention makes it possible to resolve at least one of the problems set forth above.

The invention thus has as an object a method for integration of a GPS emulator in a simulation environment comprising a computer adapted for using a simulation timer and for receiving a signal of x_PPS type, the said emulator being adapted for transmitting the said signal of x_PPS type, the method comprising the following steps, for each pulse detected on the said x_PPS signal:
updating a counter for number of pulses detected; and,
storing the value of the said simulation timer;
evaluating a given moment, in the clock of the said emulator, according to the value of the said counter for number of pulses, the value of the said simulation timer and the said stored value of the said simulation timer.

In this way the method according to the invention makes it possible to ensure the connection in real time, in closed loop, between a simulation computer and an RF GPS emulator so as to be able to use a synchronized mode according to which commands describing the path and attitude of the vehicle are precisely dated.

The said counter for number of detected pulses advantageously is initialized at the time of detection of the first pulse following the beginning of a simulation so as to show directly, roughly, the said given moment.

According to a specific embodiment, the said step of evaluating a given moment is based on the following relationship, $$t_k = \frac{(n-1)}{x} + (t'_k - t'_i)$$

where n is the value of the said counter for number of pulses, $t'_k$ is the value of the said simulation timer and $t'_i$ is the said stored value of the said simulation timer.

The method further preferably comprises a step of verifying the validity of the detected pulse, the said steps of updating a counter for number of detected pulses and storing the value of the said simulation timer being performed only if the detected pulse is valid. In this way the determination of the said given moment is not disrupted by the detection of interference pulses.

According to a specific embodiment, the said step of verifying the validity of a detected pulse comprises a step of comparing the time interval separating the moment of detection of the said detected pulse and the moment represented by the said stored value of the said simulation timer with at least one predetermined threshold.

Still according to a specific embodiment, the said signal of x_PPS type is a signal of 1_PPS type.

The method advantageously further comprises the following steps,
   transmitting to the said emulator data characteristic of a position; and,
   transmitting to the said emulator the said evaluated moment corresponding to the said position.

In this way the method allows the said emulator to determine a GPS signal corresponding to the said position and to the said evaluated moment.

The invention also has as an object a computer program comprising instructions adapted for the implementation of each of the steps of the method described above when the said program is run on a computer.

The invention likewise has as an object a device comprising means adapted for the implementation of each of the steps of the method described above. According to a specific embodiment, the said x_PPS signal is at least partially transmitted in optical form to allow its transmission to a remote device.

BRIEF DESCRIPTION OF THE DRAWINGS

Other advantages, purposes and characteristics of this invention become apparent from the detailed description that follows, provided by way of non-limitative example, with reference to the attached drawings in which.

DESCRIPTION OF THE PREFERRED EMBODIMENTS

In general, the invention seeks to combine the information items received from an external synchronization signal with data from an internal simulation timer of an expansion card or a computer in order to calculate a precise moment, synchronized with the external timer on which the synchronization signal is based.

The RF GPS emulators generally comprise an output called 1_PPS_OUT (PPS being the abbreviation for Pulse Per Second in English terminology), the associated 1_PPS signal of which has very precisely one pulse per second. This signal can be used in particular for servo-controlling the timer of an expansion card or of a computer.

Nonetheless, since the timers of the computers and of the expansion cards used for certain simulations cannot have servo-control, the 1_PPS signal is used, in accordance with the invention, to store the value of a simulation timer which itself is used to calculate a given moment.

In this way, an expansion card of time-card type integrating a counter forming a simulation timer, generally called master timer in English terminology, may be used by the computer to serve as a reference in the course of the simulation. This preferably is used in real time and in closed loop, that is to say that an input of the computer is connected to the output of the emulator and vice versa.

Such a card is, for example, the MPIO2-HR of the company Encore. It further comprises an input, called XLMT (abbreviation for Latch Master Timer in English terminology) that can be used to control storage of the content of the master timer simulation timer at the precise moment at which a pulse is detected.

Figure 1:
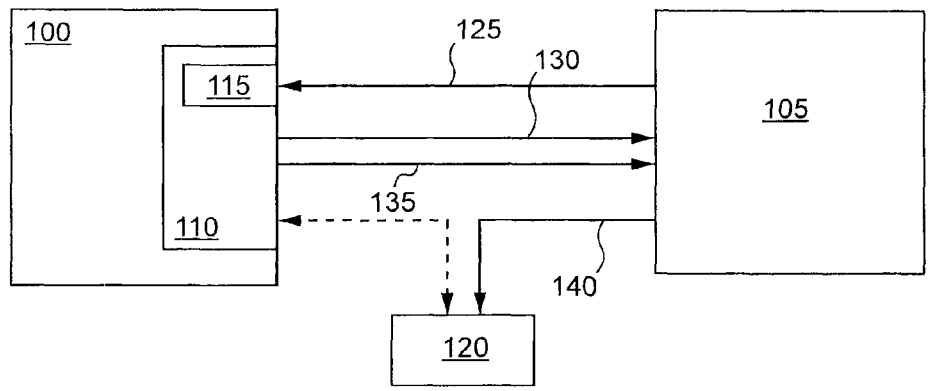
FIG. 1 schematically illustrates a simulation environment for a navigation system using an RF GPS emulator.
Figure 2:
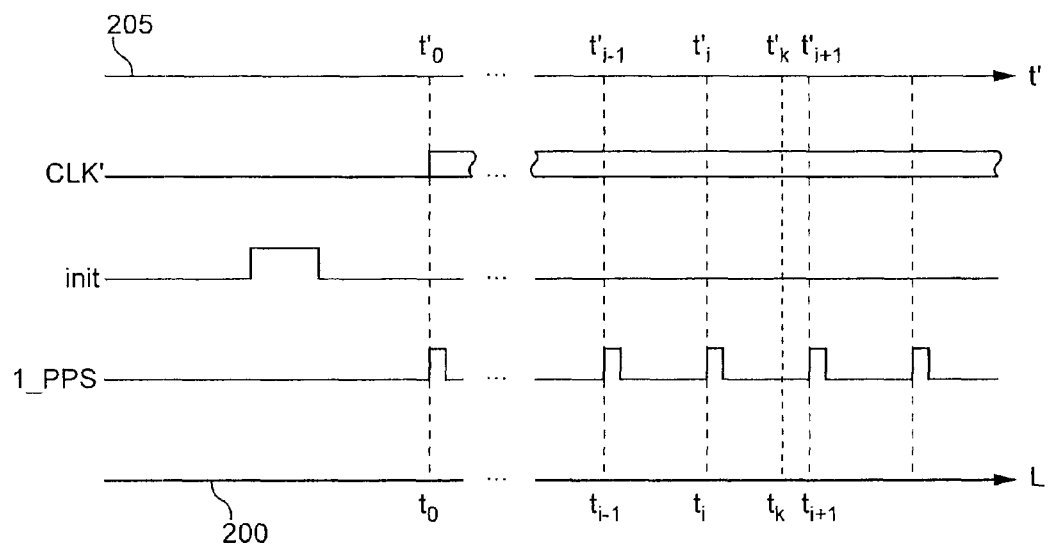
FIG. 2 schematically shows the clock of an emulator, the clock of an expansion card or of a computer, the 1_PPS signal generated by the emulator, an initialization signal and the timer signal of the expansion card or the calculator.

FIG. 2 schematically shows the clock of an emulator, referenced 200, the clock of an expansion card or of a computer, referenced 205, the 1_PPS signal generated by the emulator, an initialization signal and the timer signal, referenced CLK', of the expansion card or the computer. Thus, at moment $t_i$, the emulator generates a pulse on the 1_PPS signal that is transmitted to the expansion card or to the computer. Very precisely one second later, at moment $t_{i+1}$, the emulator generates another pulse on the 1_PPS signal, also transmitted to the expansion card or to the computer.

An initialization signal, referenced init, is used to initialize the simulation. Output 1_PPS_OUT is active only during simulations, that is to say after having received the init signal, when a GPS signal is to be generated. As illustrated, when output 1_PPS_OUT is inactive, the signal transmitted by this output does not include any pulse.

When the expansion card or the computer detects a pulse on the 1_PPS signal received, the value of the timer, that is to say the value represented by the CLK' signal, is stored. Thus, at moment $t_i$, the expansion card or the computer stores the moment $t'_i$. Likewise, at the moment $t_{i+1}$, the expansion card or the computer stores the moment $t'_{i+1}$.

By way of illustration, Table 1, appearing as an Attachment, provides an example of CLK' timer values stored at each pulse of the 1_PPS signal. It thus may be seen that the timer of the expansion card or of the computer is not synchronized with that of the RF GPS emulator.

In parallel manner, a counter is used to count the number of pulses received on the 1_PPS signal. This counter may be based on the change in the value of the stored timer signal. The counter for the number of pulses received preferably is reinitialized at each simulation, for example on reception of the first pulse following a command for initialization, the first pulse corresponding to the moment zero ($t_0=0$).

Figure 3:
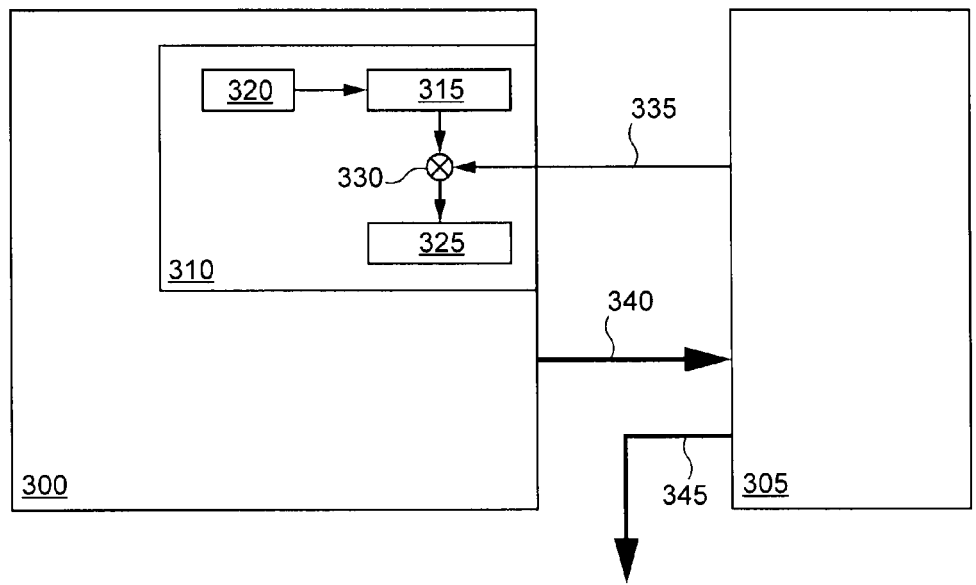
FIG. 3 illustrates an exemplary system used to simulate certain characteristics of an aircraft, in particular its navigation system, using a simulation computer and an RF GPS emulator.

FIG. 3 illustrates an exemplary system used to simulate certain characteristics of an aircraft, in particular its navigation system, using a simulation computer 300 and an RF GPS emulator 305.

Computer 300 here comprises a time card 310 which itself comprises a simulation timer 315 controlled by an internal timer 320 and a memory 325 adapted for storing a value of the simulation timer 315. Time card 310 also comprises a controller 330 for transferring the value of the simulation timer 315 into memory 325 on reception of a pulse 335.

Furthermore, communication bus 340 allows computer 300 to transfer position and time information items to emulator 305. Communication bus 345 is used to transmit the GPS signal determined in emulator 305 from data received via communication bus 340 to an avionic testing computer (not shown).

The moment $t_k$, in the clock associated with emulator 305, corresponding to a moment $t'_k$ in the clock associated with computer 300, is determined in two phases. A first phase has as an object to determine the time elapsed, in seconds, since the beginning of the simulation. This time is given, within one second, by the number of pulses received. A second phase makes it possible to calculate the fractional part of the time. This fractional part is obtained from $t'_k$ and $t'_i$, where $t'_i$ is the last value of the simulation timer stored.

Thus, the moment $t_k$ is calculated according to the following relationship, $$t_k = (n-1) + (t'_k - t'_i) \quad \text{(equation 1)}$$

where n is the number of pulses received via the 1_PPS signal.

The computer then is able to transmit to the emulator position information items of the latitude, longitude and altitude type as well as the corresponding precise moment, in the clock of the emulator, to allow the latter to determine the corresponding GPS signals.

Figure 4:
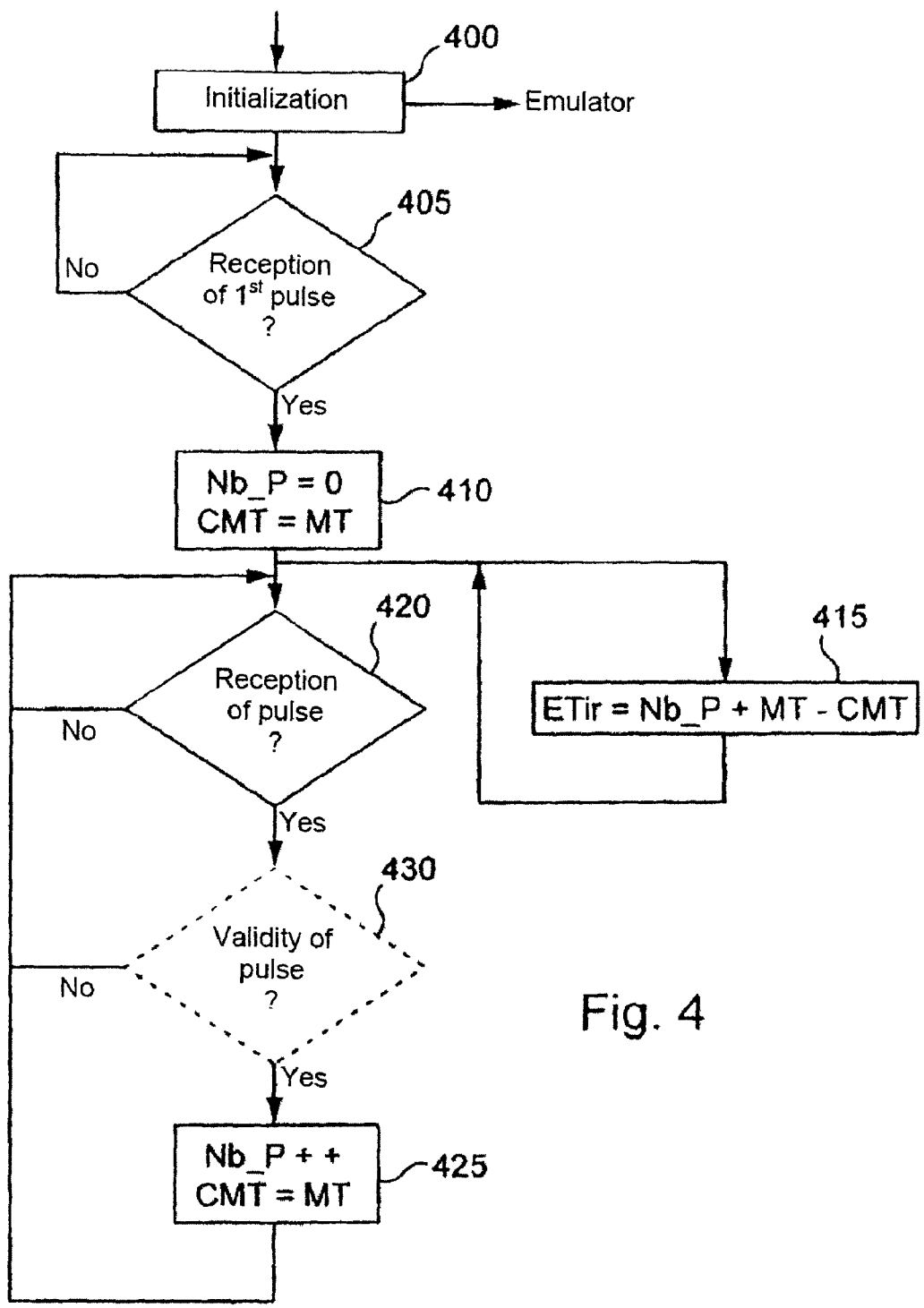
FIG. 4 shows an exemplary algorithm for determining the time in a simulation computer in accordance with a clock of an emulator transmitting a 1_PPS signal to this computer.

FIG. 4 shows an exemplary algorithm for determining the time in a simulation computer in accordance with a clock of an emulator transmitting a 1_PPS signal to this computer.

A first step has as an object to initialize the simulator (step 400). This step seeks in particular to generate an initialization command to the emulator and to start the simulation timer.

When the first pulse of the 1_PPS signal is detected (step 405), the pulse counter, called Nb_P (for Number of Pulses in English terminology), is initialized at zero and the value of the simulation timer, called Master Timer or MT, is stored in the variable called Copy of Master Timer or CMT (step 410).

The time, in accordance with the clock of the emulator transmitting the 1_PPS signal, called ETir (abbreviation for Estimated_Time_into_run in English terminology), then is estimated continuously (step 415) or on request. As indicated above, this time is equal to the number of pulses received after the first to which there is added the difference between the simulation timer value and the last stored value of the simulation timer, or $$ETir = Nb\_P + MT - CMT$$

This value may be transmitted in particular to the emulator with position indications to allow it to generate the corresponding GPS signals.

Simultaneously, at each detection of a new pulse (step 420), the variable representing the number of pulses received is incremented by one and the value MT of the simulation timer is stored in the variable CMT (step 425).

The algorithm advantageously further comprises a step of verifying the validity of the pulse received (optional step 430). According to a specific embodiment, this test has as an object to compare the time interval separating the reception of a pulse and the reception of the preceding pulse with predetermined thresholds. In other words, this test seeks to use a mask according to which a pulse is taken into consideration only if it is located in a predetermined time window, following the reception of the last pulse. If the detected pulse does not belong to the time window, it is ignored; otherwise it is processed as indicated above.

Figure 5:
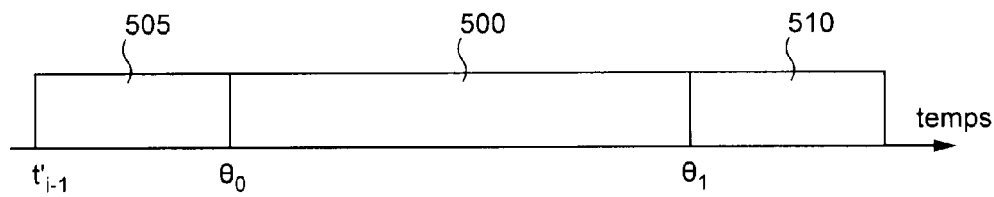
FIG. 5 illustrates an exemplary time window that may be used for determining the validity of a detected pulse; and, FIG. 6 illustrates an exemplary device adapted for implementing the invention or a part of the invention.

FIG. 5 illustrates an exemplary time window that may be used to determine the validity of a detected pulse. The horizontal arrow here represents the time axis, the point $t'_{i-1}$ corresponding to the moment at which the preceding pulse was received. If a pulse is received between the moments marked $\theta_0$ and $\theta_1$ (reference 500), it is considered as valid. If it is received between the moments $t'_{i-1}$ or $\theta_0$ after the moment $\theta_1$ (references 505 and 510), it is ignored. For a 1_PPS signal, the moments $\theta_0$ and $\theta_1$ are, for example, equal to 500 ms and 1500 ms, respectively.

The threshold $\theta_0$ thus is used to form an anti-rebound filter according to which no pulse is taken into consideration immediately after a pulse considered as valid. Correlatively, the threshold $\theta_1$ is used to detect the loss of the 1_PPS signal and to generate an alarm so as to warn the user.

It should be noted that while the examples provided above are, for reasons of clarity, based on the use of a 1_PPS signal, the method and the device for integration of an RF GPS emulator in a simulation environment may use other signals comprising regular pulses. In this way, if the invention is implemented with an x_PPS signal in which x is the period of time separating two consecutive pulses, expressed in seconds, equation 1 is written in the following form, $$t_k = \frac{(n-1)}{x} + (t'_k - t'_i)$$

The value x is to be transmitted to the computer before the simulation or at the beginning thereof.

Furthermore, it should be noted that the 1_PPS or x_PPS signal is a low-frequency type signal and that consequently it may be transmitted over a great distance. Transmission of the 1_PPS or x_PPS signal may be accomplished electrically and/or optically.

Figure 6:
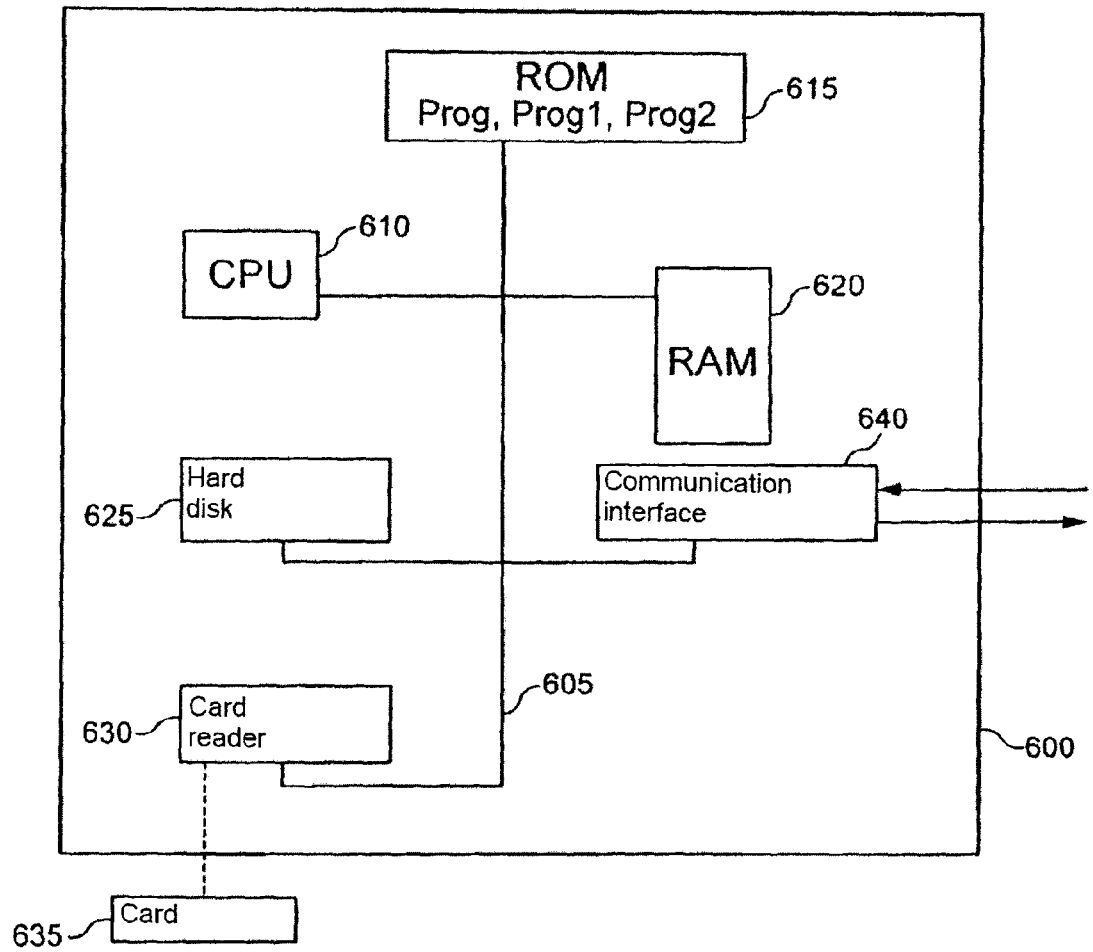

A device adapted for implementing the invention or a part of the invention is illustrated on FIG. 6. The device shown preferably is a standard device, for example a computer or a server.

Device 600 here comprises an internal communication bus 605 to which there are connected:
- a central processing unit or microprocessor 610 (CPU, abbreviation for Central Processing Unit in English terminology);
- a read-only memory 615 (ROM, acronym for Read Only Memory in English terminology) able to comprise the programs necessary for implementation of the invention;
- a random-access memory or cache memory 620 (RAM, acronym for Random Access Memory in English terminology) comprising registers adapted for recording variables and parameters created and modified during running of the aforementioned programs;
- a communication interface 640 adapted for transmitting and receiving data to and from a communication network, for example a switched-type network.

Device 600 also preferably has the following components:
- a hard disk 625 able to comprise the aforementioned programs and data processed or to be processed according to the invention; and
- a memory card reader 630 adapted for receiving a memory card 635 and for reading therein or for writing therein data processed or to be processed according to the invention.

The internal communication bus allows communication and interoperability between the various components included in device 600 or connected thereto. In particular, a time-card type expansion card such as that described above may be connected to internal communication bus 605 in order to implement the invention.

The representation of the internal bus is not limitative and, in particular, the microprocessor is capable of communicating instructions to any component of device 600 directly or through another component of device 600.

The executable code of each program allowing the programmable device to implement the processes according to the invention may be stored, for example, on hard disk 625 or in read-only memory 615.

According to a variant, memory card 635 may contain data, in particular a table of correspondence between the events detected and the commands that may be requested, as well as the executable code of the aforementioned programs which, once read by device 600, is stored on hard disk 625.

According to another variant, the executable code of the programs will be able to be received, at least in part, through first communication interface 640, to be stored in a manner identical to that described above.

More generally, the program or programs could be loaded into one of the storage means of device 600 before being run.

Microprocessor 610 is going to control and direct the execution of the instructions or portions of software code of the program or programs according to the invention, which instructions are stored on hard disk 625 or in read-only memory 615 or else in the other aforementioned storage components. During boot-up, the program or programs that are stored in a non-volatile memory, for example hard disk 625 or read-only memory 615, are transferred into random-access memory 620 which then contains the executable code of the program or programs according to the invention, as well as the registers for storing the variables and parameters necessary for implementation of the invention.

The communication apparatus comprising the device according to the invention also may be a programmed apparatus. This apparatus then contains the code of the computer program or programs for example set in an application-specific integrated circuit, also called ASIC (acronym for Application-Specific Integrated Circuit in English terminology).

Naturally, in order to meet specific needs, an individual competent in the area of the invention will be able to apply modifications in the foregoing description.

ATTACHMENT

| $t_i$  | 1.000 | 2.000 | 3.000 | 4.000 | 5.000 | 6.000 | 7.000 | 8.000 |
|--------|-------|-------|-------|-------|-------|-------|-------|-------|
| $t'_i$ | 0.998 | 1.999 | 3.001 | 3.997 | 4.998 | 6.002 | 7.000 | 7.966 |

The invention claimed is:

1. A method for using a GPS emulator in a simulation environment including a computer adapted for using a simulation timer, the method comprising:
   receiving an x_PPS signal having pulses regularly spaced apart by one or more seconds at the computer from the GPS emulator;
   for each pulse detected by the computer on the x_PPS signal
      updating a counter with a counted number of detected pulses on the x_PPS signal, and
      storing a value of the simulation timer having a resolution of a fractional part of a second; and
   evaluating a given simulation time moment according to the counted number of detected pulses, a current value of the simulation timer, and the stored value of the simulation timer.

2. The method according to claim 1, further comprising:
   initializing the counter at a time of detection of a first pulse following a beginning of a simulation.

3. The method according to claim 1 or claim 2, wherein the evaluating the given simulation time moment is based on the following relationship:

$$t_k = \frac{(n-1)}{x} + (t'_k - t'_i)$$

where n is the counted number of pulses, $t'_k$ is the current value of the simulation timer, and $t'_i$ is the stored value of the simulation timer.

4. The method according to claim 1, further comprising:
   verifying validity of a detected pulse; and
   preventing the updating the counter with the counted number of detected pulses and preventing the storing the value of the simulation timer if the detected pulse is not valid.

5. The method according to claim 4, wherein the verifying the validity of the detected pulse includes comparing a time interval separating a moment of detection of the detected pulse and a moment represented by the stored value of the simulation timer with at least one predetermined threshold.

6. The method according to claim 1, wherein the x_PPS signal is a 1_PPS signal having pulses regularly spaced apart by one second.

7. The method according to claim 1, further comprising:
   transmitting, to the emulator, data characteristic of a position; and
   transmitting, to the emulator, the evaluated given simulation time moment corresponding to the position to allow the emulator to determine a GPS signal corresponding to the position and the evaluated given simulation time moment.

8. A non-transitory computer readable medium storing instructions, which, when executed by a computer in a simulation environment including a GPS emulator and having a simulation timer, cause the computer to perform a method comprising:
   receiving an x_PPS signal having pulses regularly space apart by one or more seconds at the computer from the GPS emulator;
   for each pulse detected by the computer on the x_PPS signal
      updating a counter with a counted number of detected pulses on the x_PPS signal, and
      storing a value of the simulation timer having a resolution of a fractional part of a second; and
   evaluating a given simulation time moment according to the counted number of detected pulses, a current value of the simulation timer, and the stored value of the simulation timer.

9. A GPS simulation apparatus comprising:
   a computer having a simulation timer and configured to receive an x_PPS signal having pulses regularly spaced apart by one or more seconds from a GPS emulator, the simulation timer having a resolution of a fractional part of a second;

a counter that is updated with a counted number of pulses detected by the computer when each pulse is detected by the computer;

a memory that stores a value of the simulation timer operating at a frequency greater than the x_PPS signal when each pulse is detected by the computer; and the computer is further configured to evaluate a given simulation time moment according to the counted number of detected pulses, a current value of the simulation timer, and the stored value of the simulation timer.

10. The apparatus according to claim 9, wherein the x_PPS signal is at least partially transmitted in optical form.

11. The apparatus according to claim 9, further comprising:

an initialization section that initializes the counter at a time of detection of a first pulse following a beginning of a simulation.

12. The apparatus according to claim 9, wherein:

the computer is further configured to evaluate the given simulation time moment based on the following relationship:

$$t_k = \frac{(n-1)}{x} + (t'_k - t'_i)$$

where n is the counted number of pulses, $t'_k$ is the current value of the simulation timer, and $t'_i$ is the stored value of the simulation timer.

13. The apparatus according to claim 9, wherein:

the computer is further configured to verify validity of a detected pulse; and the computer is further configured to prevent updating the counter with the counted number of detected pulses and preventing the storing the value of the simulation timer if the detected pulse is not valid.

14. The apparatus according to claim 13, wherein:

the computer validates the validity of the detected pulse by comparing a time interval separating a moment of detection of the detected pulse and a moment represented by the stored value of the simulation timer with at least one predetermined threshold.

15. The apparatus according to claim 9, wherein the x_PPS signal is a 1_PPS signal having pulses regularly spaced apart by one second.

16. The apparatus according to claim 9, further comprising:

the computer is further configured to transmit, to the emulator, data characteristic of a position; and the computer is further configured to transmit, to the emulator, the evaluated given simulation time moment corresponding to the position to allow the emulator to determine a GPS signal corresponding to the position and the evaluated given simulated time moment.

* * * * *